(12) United States Patent
Yamamoto et al.

(10) Patent No.: US 6,448,800 B1
(45) Date of Patent: Sep. 10, 2002

(54) LOAD CURRENT OUTPUT CIRCUIT FOR ELECTRONIC DEVICE AND IC TESTER USING THE SAME LOAD CURRENT OUTPUT CIRCUIT

(75) Inventors: Keiichi Yamamoto, Kanagawa; Yoshihiko Hayashi, Tokyo; Akio Oosaki, Kanagawa, all of (JP)

(73) Assignee: Hitachi Electronics Engineering Co., Ltd., Tokyo (JP)

( * ) Notice: Subject to any disclaimer, the term of this patent is extended or adjusted under 35 U.S.C. 154(b) by 141 days.

(21) Appl. No.: 09/598,494

(22) Filed: Jun. 22, 2000

(30) Foreign Application Priority Data

Jun. 25, 1999 (JP) ............................................ 11-180248

(51) Int. Cl.$^7$ ............................................... G01R 31/02
(52) U.S. Cl. ........................................ 324/763; 324/765
(58) Field of Search ................................. 324/126, 128, 324/158.1, 763, 765; 714/25, 724, 699

(56) References Cited

U.S. PATENT DOCUMENTS

| | | | | |
|---|---|---|---|---|
| 5,200,696 A | * | 4/1993 | Menis et al. ............. | 324/158.1 |
| 5,266,894 A | * | 11/1993 | Takagi et al. ............. | 324/765 |
| 5,945,822 A | * | 8/1999 | Shiotsuka ................ | 324/158.1 |
| 6,157,200 A | * | 12/2000 | Okayasu .................. | 324/753 |
| 6,275,023 B1 | * | 8/2001 | Oosaki et al. ............ | 324/158.1 |

FOREIGN PATENT DOCUMENTS

| | | |
|---|---|---|
| JP | 62-116272 | 5/1987 |
| JP | 2-128176 | 5/1990 |
| JP | 6-82527 | 3/1994 |

* cited by examiner

Primary Examiner—Michael Sherry
Assistant Examiner—Minh N. Tang
(74) Attorney, Agent, or Firm—Mattingly, Stanger & Malur

(57) ABSTRACT

An IC tester includes a detection circuit for detecting a voltage level on a portion of a transmission line on a side thereof, which receives the output signal from an electronic device under test through the transmission line. A predetermined current is pulled in from the transmission line when the voltage level detected by the detection circuit is at a low level and a predetermined current equal to or different from the predetermined current to be pulled in is supplied to the transmission line when the detected voltage level detected by the detection circuit is at a high level.

13 Claims, 5 Drawing Sheets

LOAD CURRENT OUTPUT CIRCUIT FOR ELECTRONIC DEVICE AND IC TESTER USING THE SAME LOAD CURRENT OUTPUT CIRCUIT

BACKGROUND OF THE INVENTION

1. Field of the Invention

The present invention relates to a load current output circuit for supplying a load current to an electronic device and an IC tester using the same load current output circuit and, particularly, to a dynamic load current output circuit for supplying or sinking a load current to or from an output terminal of an electronic device under test (DUT), which is capable of accurately measuring a signal rising time tr or a signal falling time tf when a rate of an output signal of the DUT becomes high and an IC tester using the same dynamic load current output circuit.

The load current output operation of the dynamic load current output circuit includes a pull operation to sink a current from the DUT.

2. Description of the Related Art

It has been known that an IC tester functions to preliminarily apply a predetermined voltage pulse signal to a predetermined terminal of an electronic device under test (DUT) and to judge, by a judge circuit thereof, whether a waveform of an output signal outputted from an output terminal (or an input/output terminal) of the DUT after a predetermined time from the application of the predetermined voltage pulse signal is in a high (H) level or a low (L) level according to a strobe signal generated with a predetermined timing. In this judge mode operation of the IC tester, when the IC tester measures the signal rising time tr or the falling time tf of the output signal of the DUT, the strobe signal having a predetermined period is applied to the judge circuit and a time from a time instance at which the strobe signal becomes "L" (or "H") to a time instance at which it becomes "H" (or "L") is measured. Further, an operation test or performance test, etc., of the DUT is performed by comparing the result of judgement with an expected value.

In the time measurement, in order to simulate a state where the DUT is connected to other device, a load current of a predetermined current value, for example, several mA to several tens mA, is preliminarily supplied to a specific output terminal of the DUT and the judgement of the level of the output signal of the DUT, "H" or "L", is performed. In order to realize this, the IC tester is provided with a dynamic load current output circuit for supplying a load current to the output terminal of the DUT in the judge mode operation. The dynamic load current output circuit is usually connected to the output terminal of the DUT through a diode switch circuit provided therein.

Examples of the dynamic load current output circuit are disclosed in Japanese Patent Application Laid-open Nos. S62-116272, H2-128176 and H6-82527, etc As shown in FIG. 5, which shows a relation of output current of a DUT and an output terminal voltage of the DUT, such dynamic load current output circuit pulls in a current IOH from the DUT when the output signal of the DUT is changed from "L" to "H" and supplies a current IOL to the DUT when the output signal thereof is changed from "H" to "L". Therefore, the IC tester can, in the IC test mode, simulate a value and a flowing direction of current in a state where some device is connected to the output terminal of the DUT.

The diode switch circuit is usually constructed with a diode bridge and supplies the load current to the DUT by ON/OFF controlling the diode correspondingly to the state of the output signal at the output signal terminal of the DUT.

FIG. 6 is a circuit diagram of a conventional dynamic load current output circuit 40 of an IC tester. As shown in FIG. 6, the dynamic load current output circuit 40, together with a driver 2 and a comparator 3, etc., is connected to a DUT 5 through a transmission line 1. Further, the dynamic load current output circuit 40 is connected between a positive power source +VCC and a negative power source −VEE and has a constant current source IOL for supplying a current IOL and a constant current source IOH for sinking a current IOH.

The comparator 3 is activated in the judge mode and, as mentioned previously, compares an input voltage with a reference voltage VTH according to a strobe signal generated with a predetermined timing and judges whether the input voltage level is "H" or "L".

Incidentally, a reference numeral 4 denotes an input/output (I/O) switching circuit, I/O denotes a control bit signal for ON/OFF controlling the input/output switching circuit, 5a denotes an input/output (I/O) terminal of the DUT 5 and VS denotes a switching control voltage signal for the diode switch.

In the conventional IC tester constructed as mentioned above, there is a delay time $\tau$ of the transmission line 1 between the DUT 5 (an A point) and the dynamic load current output circuit 40 (a B point). Therefore, when the rising time tr of the output signal of the DUT 5 from "L" to "H" becomes smaller than the delay time $\tau$ (tr<$\tau$) due to increase of the frequency of the output signal of the DUT 5, the transition of the output signal of the DUT 5 from "L" to "H" is completed before the dynamic load current output circuit 40 sinks the current IOH in response to the transition of the DUT 5. In such case, the dynamic load current output circuit 40 supplies the current IOL to the DUT 5 in the transition from "L" to "H". The current thus supplied to the DUT 5 functions to increase the rising rate of the output signal of the DUT 5. Therefore, the dynamic load current output circuit 40 not only performs its own function but also adversely affects the measurement.

This phenomenon is also true for the transition of the output signal of the DUT 5 from "H" to "L". Therefore, when the frequency of the output signal of the DUT 5 is increased, it becomes impossible to precisely measure the signal rising time tr or the signal falling time tf of the output signal of the DUT5.

SUMMARY OF THE INVENTION

An object of the present invention is to provide a dynamic load current output circuit capable of precisely measuring the rising time tr or the falling time tf of an output signal of a DUT even when a frequency of the output signal is increased.

Another object of the present invention is to provide an IC tester using the same dynamic load current output circuit.

In order to achieve the above objects, the dynamic load current output circuit according to the present invention comprises a detector circuit for detecting a voltage level at an end of a transmission line, which is connected to the dynamic load current output circuit and receives an output signal from an electronic device under test through the transmission line or other transmission line. The dynamic load current output circuit pulls in a predetermined current from the transmission line or the other transmission line when the voltage level detected by the detection circuit is in low level and supplies a predetermined current equal to or different from the predetermined current to be pulled in to the transmission line or the other transmission line when the detected voltage level is in high level.

As mentioned above, the voltage level of the output signal of the electronic device under test at one end of the transmission line or the other transmission line, which is connected to the dynamic load current output circuit is detected by the detection circuit. When the currently detected voltage level of the output signal of the electronic device is "L", a next voltage level transition at that point is to "H". Therefore, when the output signal of the device under test is changed from "L" to "H", the dynamic load current output circuit preliminarily pulls in a predetermined current IOH from the transmission line prior to the transition time instance. When the currently detected voltage level is "H", a next voltage level transition is to "L". Therefore, when the output signal of the device under test is changed from "H" to "L", the dynamic load current output circuit preliminarily supplies a predetermined current IOL to the transmission line prior to the transition time instance.

Therefore, in the dynamic load current output circuit and the IC tester having the same dynamic load current output circuit, which is connected to the electronic device under test through the transmission line, it is possible to supply a current to the electronic device or sinks a current therefrom when the output signal of the electronic device is changed from "L" to "H" or from "H" to "L", without influence of the delay time of the transmission line.

As a result, it becomes possible to precisely measure the rising time tr or the falling time tf of the output signal of the electronic device even when the transition rate of the output signal of the electronic device becomes high.

BRIEF DESCRIPTION OF THE DRAWINGS

This above mentioned and other objects, features and advantages of the present invention will become more apparent by reference to the following detailed description of the invention taken in conjunction with the accompanying drawings, in which.

DETAILED DESCRIPTION OF THE PREFERRED EMBODIMENTS

Figure 1:
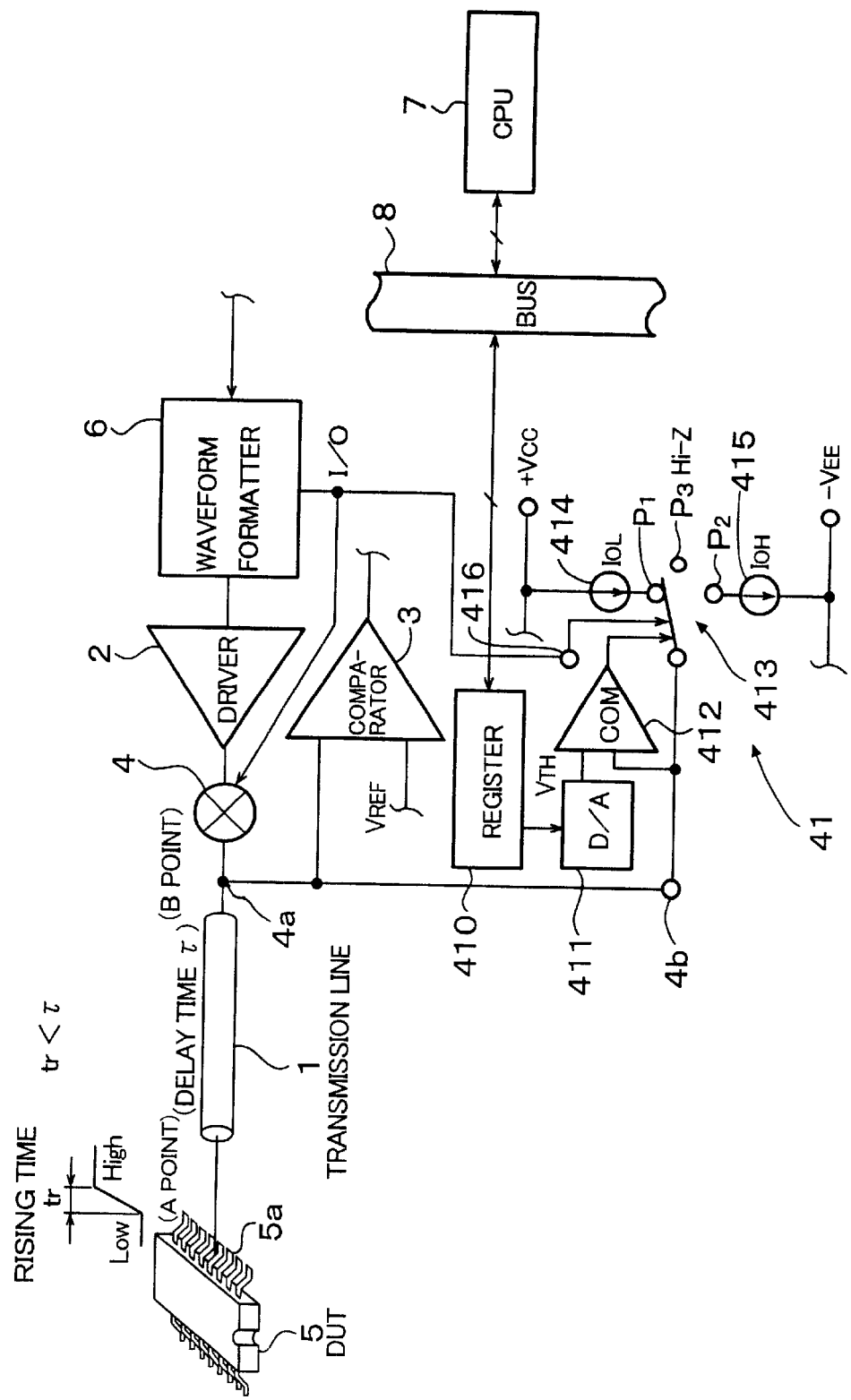
FIG. 1 is a block circuit diagram of a dynamic load current output circuit of an IC tester, according to an embodiment of the present invention.
Figure 6:
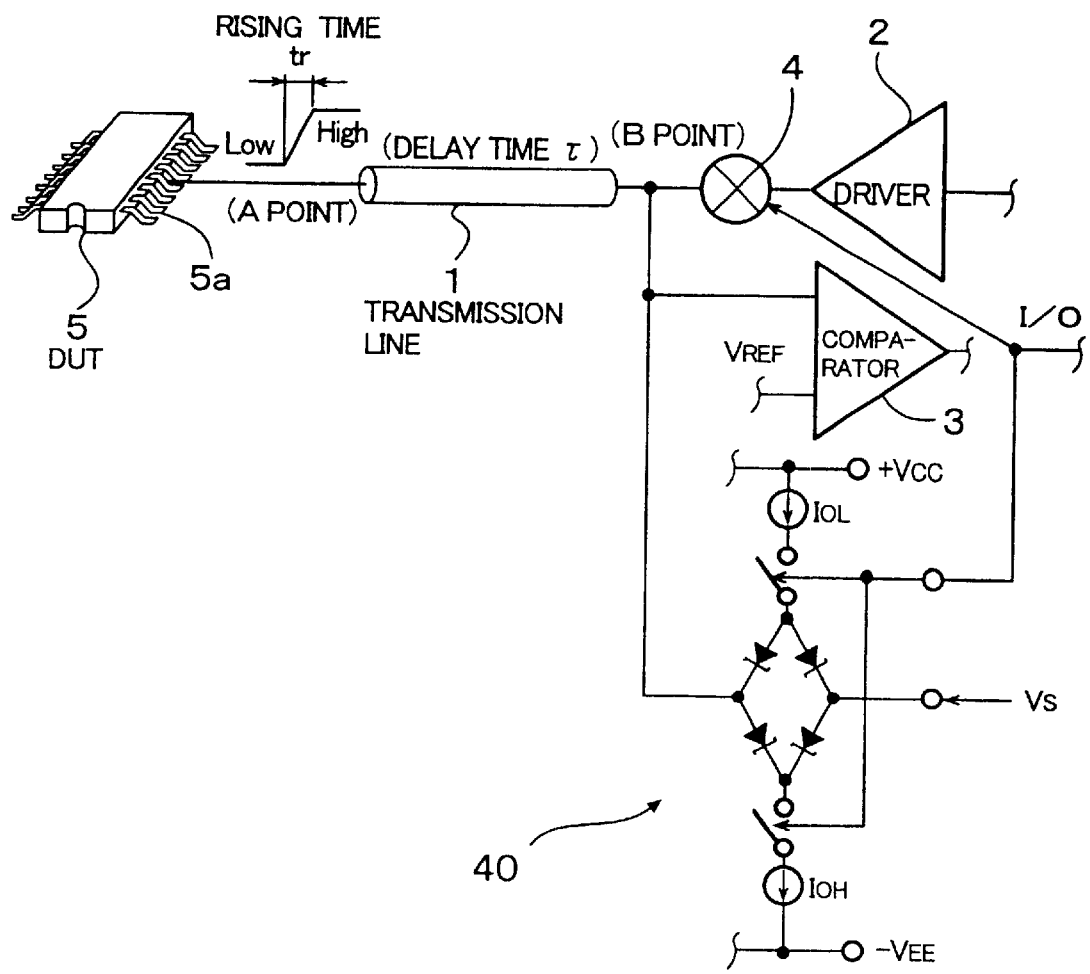
FIG. 6 is a block diagram of a conventional dynamic load current output circuit of an IC tester.

FIG. 1 is a block circuit diagram of an IC tester including a dynamic load current output circuit 41 according to the present invention. It should be noted, in FIG. 1, that same constructive components as those shown in FIG. 6 are depicted by same reference numerals, respectively, without detailed description thereof.

In FIG. 1, the dynamic load current output circuit 41, a driver 2 and a comparator 3 are connected to an input/output terminal 5a of an electronic device 5 under test (DUT) through a transmission line 1. The dynamic load current output circuit 41 is supplied, from a waveform formatter 6, with a bit signal I/O for ON/OFF controlling an ON/OFF switch 4. A reference value data for comparison, which controls the IC tester, is supplied from a CPU 7 to a register 410 through a bus 8.

The bit signal I/O for ON/OFF controlling the I/O switch 4 is usually generated by a predetermined logical operation of a control signal outputted from a pattern generator and a timing signal outputted from a timing generator and outputted from the waveform formatter 6. However, the bit signal I/O may be generated separately or directly by other circuit or a circuit including such pattern generator and timing generator and supplied to the dynamic load current output circuit 41.

The dynamic load current output circuit 41 is composed of the register 410, a digital/analog (D/A) converter circuit 411, an analog comparator (COM) 412, a switch circuit 413, a constant current source 414 connected to the positive power source +VCC and supplying a current IOL, and a constant current source 415 connected to the negative power source −VEE and supplying a current IOH. The dynamic load current output circuit 41 performs a switching operation in an opposite manner to the switching operation of the dynamic load current output circuit 40 shown in FIG. 6, in response to the level, "H" or "L", at a connecting point 4a (B point) between an output terminal of the I/O switch circuit 4 and the transmission line 1. Incidentally, the connecting point 4a is in a wiring line of the transmission line 1 on the IC tester side, to which an output signal of the DUT 5 is supplied from the other wiring line of the transmission line 1.

The D/A converter circuit 411 converts a digital data value from the register 410 into an analog value and outputs the analog value to one of input terminals of the comparator circuit 412 as a reference voltage VTH. The other input terminal of the comparator circuit 412 is connected to an input/output terminal 4b of the dynamic load current output circuit 41. The comparator circuit 412 compares a voltage level of the input/output terminal 4b connected to the B point with the analog output voltage level of the D/A converter circuit 411 and sends a result of comparison to the switch circuit 413.

The switch circuit 413 is a single-throw triple-pole switch. The input terminal of the switch circuit 413 is connected to the B point (connecting point 4a) through the input/output terminal 4b of the dynamic load current output circuit 41 and one of the three output terminals P1, P2 and P3 thereof is selected by a control signal and connected to the B point (connecting point 4a). The terminal P1 is connected to the constant current source 414, the terminal P2 is connected to the constant current source 415 and the terminal P3 is a floating terminal or is maintained at high resistance state.

The dynamic current load circuit 41 has the input/output terminal 4b connected to the B point (connecting point 4a) as mentioned above. When the output signal of the DUT 5 is received at the B point (connecting point 4a), which is the output terminal of the I/O switch circuit 4 (driver 2), the comparator circuit 412 of the dynamic load current output circuit 41 compares the output signal of the DUT 5 with the reference voltage VTH to determine whether the voltage at the B point is "H" or "L" at an input/output switching timing (when the bit signal I/O for ON/OFF controlling the I/O switch 4 becomes "L"). When the level of the voltage at the B point is "H", the dynamic load current output circuit 41 switches the connection of the switch circuit 413 thereof to the terminal P1 connected to the constant current source 414 under an assumption that the output signal at the input/output terminal 5a of the DUT 5 shall be changed to "L" next to supply the current IOL thereto, and, when the level of the voltage at the B point is "L" the dynamic load current output circuit 41 switches the connection of the switch circuit 413 thereof to the terminal P2 connected to the constant current source 415 under an assumption that the output signal at the input/output terminal 5a of the DUT 5 shall be changed to "H" next to sink the current IOH.

Further, when an output waveform is generated by the driver 2 and supplied to the input terminal 5a of the DUT 5 through the ON/OFF switch 4 and the transmission line 1, that is, when the bit signal I/O for the I/O switch ON/OFF control is in "H" level, the dynamic load current output circuit 41 switches the connection of the switch circuit 413 to the high impedance terminal P3 such that the B point becomes high impedance (Hi-Z).

The switch circuit 413 performs the above mentioned switching operation in response to the control signal for selecting one of the three terminals P1, P2 and P3, which includes the bit signal I/O, "H" or "L", and the output signal of the comparator 412, "H" or "L".

Therefore, the B point is connected to the constant current source 414 or 415 through the switch circuit 413 when the bit signal I/O for the I/O switch ON/OFF control is in "L" level, that is, during a waiting time of the output of the DUT 5. The determination of the voltage at the B point, "H" or "L", is performed by comparing the reference voltage VTH with the voltage at the B point in the comparator circuit 412. Prior to the commencement of the test, data supplied from the CPU 7 through the bus 8 is stored in the register 410, converted into an analog value by the D/A converter circuit 411 and supplied to the comparator circuit 412 as the reference voltage VTH. When the voltage at the B point is higher than the reference voltage VTH, the comparator circuit 412 outputs a "H" signal, which is supplied to the switch circuit 413. In this case, when the bit signal I/O is in "L" level, the constant current source 414 is selected. When the voltage at the B point is lower than the reference voltage VTH, the comparator circuit 412 outputs a "L" signal, which is supplied to the switch circuit 413. In this case, when the bit signal I/O is in "L" level, the constant current source 415 is selected.

Describing the test operation for the DUT 5, a predetermined waveform signal is supplied to the DUT 5 according to a "H" level of the bit signal I/O from the waveform formatter 6 and, then, a signal outputted from the input/output terminal 5a of the DUT 5 is supplied to the comparator circuit 3 through the transmission line 1 according to an "L" level of the bit signal I/O after a predetermined time from the "H" level of the bit signal I/O.

The comparator circuit 3 compares the signal from the input/output terminal 5a of the DUT 5 with the reference voltage VREF to determine whether the output signal from the input/output terminal 5a is "H" or "L". When the IC tester measures the rising time tr or the falling time tf of the output signal of the DUT 5, the comparator circuit 3 is actuated by a strobe signal ST having a predetermined period to determine whether the level of the output signal is "L" or "H". The IC tester measures a time from "L" to "H" (signal rising time tr) or from "H" to "L" (signal falling time tf) on the basis of a result of determination of the comparator circuit 3. Further, the comparator circuit 3 determines the level of the output signal of the electronic device in response to a predetermined timing of the strobe signal ST and a fail bit, etc., is determined by comparing the result of level determination with an expected value supplied from a pattern generator (not shown).

When the output waveform of the DUT 5 is determined by the comparator circuit 3, a predetermined load current is supplied to the output terminal of the DUT 5 by the dynamic load current output circuit 41 in order to simulate a state in which a certain device is connected to the DUT 5. The dynamic load current output circuit 41 pulls the current IOH from the DUT 5 through the B point of the transmission line 1 prior to the output signal of the DUT 5 when the voltage of the B point (connecting point 4a) is in "L" level and, when the voltage of the B point is in "H" level, the dynamic load current output circuit 41 supplies the current IOL to the DUT 5 through the B point of the transmission line 1.

Now, a relation between the dynamic load current output circuit 41 and the load current for the DUT 5, when the delay time τ of the transmission line 1 for the output signal of the DUT 5 is problem, will be described.

Since the DUT 5 is connected to the dynamic load current output circuit 41 through the transmission line 1, the output signal of the DUT 5 reaches the dynamic load current output circuit 41 with a delay of τ. Therefore, when the rising time tr of the output signal of the DUT 5 is shorter than the delay time τ of the transmission line 1, the voltage of the B point, which is connected to the input/output terminal 4a of the dynamic load current output circuit 41, is kept in "L" level at a time when the output signal of the DUT 5 is changed in level from "L" to "H". However, as mentioned above, the dynamic load current output circuit 41 pulls in the current IOH from the DUT 5 through the input/output terminal 4a, which is connected to the connecting point 4a, from a time at which the ON/OFF control bit signal I/O of the I/O switch circuit 4 becomes "L". As a result, the dynamic load current output circuit 41 pulls in the current IOH from the DUT 5 at a time when the output signal of the DUT 5 is changed from "L" to "H". Similarly, the dynamic load current output circuit 41 supplies the current IOL to the DUT 5 at a time when the output signal of the DUT 5 is changed from "H" to "L".

Therefore, the IC tester is not influenced by the delay time τ of the transmission line 1 during the waveform determination. Particularly, when the rising time tr or the falling time tf of the output signal of the DUT 5 is measured by applying the strobe signal ST having a predetermined period to the comparator circuit 3, it is possible to precisely measure a transition time of the output signal of the DUT 5 from "L" (or "H") to "H" (or "L").

In this case, when the voltage at the B point is completely changed from "L" to "H", the dynamic load current output circuit 41 switches the switch circuit 413 thereof to the contact P1 to connect the constant current source 414 to the B point to thereby supply the current IOL to the DUT 5 under an assumption that the output signal of the DUT 5 is changed from "H" to "L" next. In this case, since there is an operational delay in the dynamic load current output circuit 41, the measurement of the signal rising time tr itself is not influenced by the delay time of the transmission line even if the switching operation for supplying the current IOL to the B point is performed upon the transition of the voltage level of the B point to "H".

On the other hand, when the voltage at the B point is completely changed from "H" to "L", the dynamic load current output circuit 41 switches the switch circuit 413 thereof to the contact P2 to connect the constant current source 415 to the B point to thereby sink the current IOL from the DUT 5 under an assumption that the output signal of the DUT 5 is changed from "L" to "H" next. In this case, the measurement of the signal falling time tf itself is not influenced by the delay time of the transmission line similarly.

In order to perform the determination of the level, "H" or "L", of the output signal of the DUT 5 with respect to the expected value, without any influence of the delay time of the transmission line, it is enough to provide a delay circuit having a delay time, which is long enough to allow such determination to perform, between the B point and the switch circuit 413.

Figure 2:
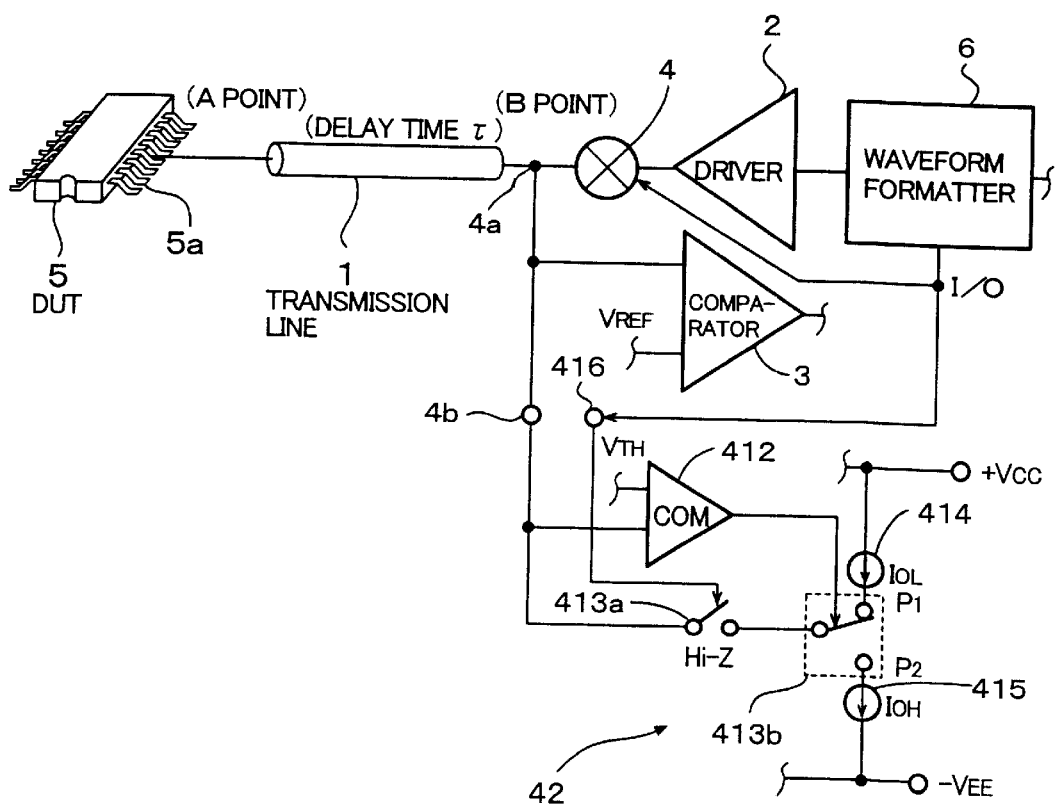
FIG. 2 is a block circuit diagram of a dynamic load current output circuit of an IC tester, according to another embodiment of the present invention.

FIG. 2 is a block circuit diagram of a dynamic load current output circuit of an IC tester, according to another embodiment of the present invention. An I/O switch circuit 4, a driver 2, a comparator circuit 3 and a dynamic load current output circuit 42 are connected to a DUT 5 through a transmission line 1. In FIG. 2, same constructive components as those shown in FIG. 1 are depicted by same reference numerals, respectively, without detailed description thereof.

In FIG. 2, the dynamic load current output circuit 42 includes a single-throw single-pole switch circuit 413a and a single-throw double-pole switch circuit 413b. Other construction of the dynamic load current output circuit 42 are the same as those of the dynamic load current output circuit 41 shown in FIG. 1. The switch circuit 413a is provided between a B point and the switch circuit 413b and ON/OFF controlled according to levels "H" and "L" of a bit signal I/O supplied from a waveform formatter 6 for ON/OFF controlling the I/O switch circuit 4. The switch circuit 413a is turned OFF when the level of the bit signal I/O is "H". During a period for which the switch circuit 413a is in an OFF state, the switch circuit 413a sets the B point to a high impedance state (Hi-Z) as in the case when the switch circuit 413 selects the terminal P3 shown in FIG. 1. Further, when the bit signal I/O is in "L" level, the switch circuit 413a is turned ON to connect the B point to the switch circuit 413b.

The switch circuit 413b selects one of the terminals P1 and P2 connected to constant current sources 414 and 415, respectively, according to the level "H" or "L" of the output signal of a comparator circuit 412, and connects the selected terminal to the B point. That is, when the bit signal I/O is in "L" level, the comparator circuit 412 generates an output indicative of "H" upon which the constant current source 414 is selected and, when the bit signal is in "H" level, the comparator circuit 412 generates an output indicative of "L" upon which the constant current source 415 is selected.

An operation of the dynamic load current output circuit 42 in the IC tester is similar to that of the dynamic load current output circuit 41 shown in FIG. 1.

Figure 3:
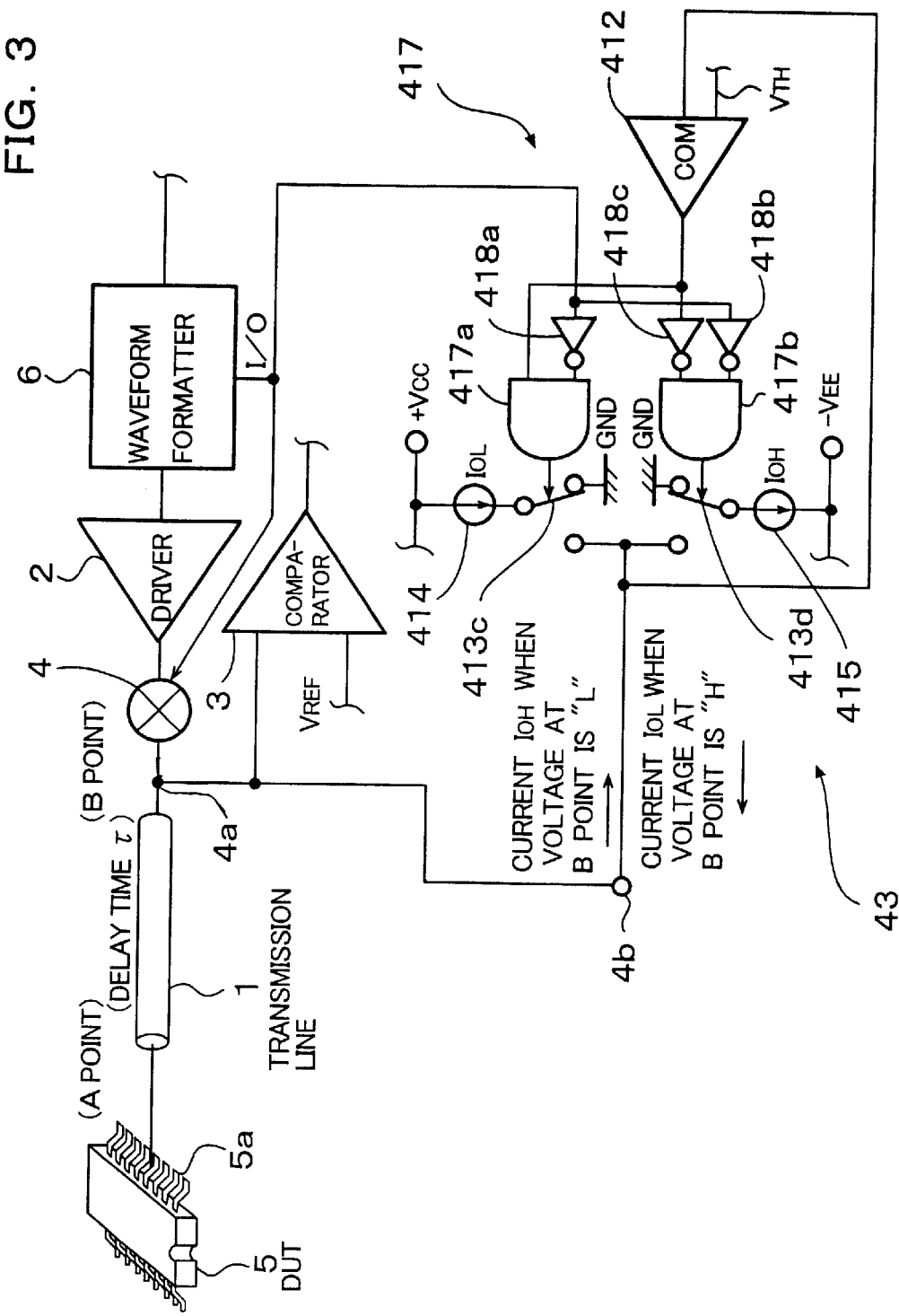
FIG. 3 is a block circuit diagram of a dynamic load current output circuit of an IC tester, according to a further/embodiment of the present invention.

FIG. 3 shows a dynamic load current output circuit 43 according to another embodiment of the present invention.

In FIG. 3, other constructive components of an IC tester than the dynamic load current output circuit 43 are similar to those shown in FIG. 1.

The dynamic load current output circuit 43 is constructed with a single-throw double-pole switch circuits 413c and 413d and a gate circuit 417 as a control circuit for controlling these switches. The switch circuit 413c functions to connect the constant current source 414 to either the B point or a ground terminal (GND) and the switch circuit 413d functions to connect the constant current source 415 to either the B point or the ground terminal.

The control circuit 417 for controlling the switch circuits 413c and 413d is composed of 2-input AND gates 417a and 417b and inverters 418a, 418b and 418c. A bit signal I/O from a waveform formatter 6 is inputted to the AND gates 417a and 417b through the inverters 418a and 418b, respectively.

When an output signal of the DUT 5 is inputted to the dynamic load current output circuit 43, that is, when the level of the bit signal I/O is "L", the bit signal I/O is inverted by the inverters 418a and 418b and resultant "H" levels are supplied to the AND gates 417a and 417b to open the gates to thereby make the them effective. When the AND gates are opened and an output of the comparator circuit 412 is "H", a "H" level signal is applied to the AND gate 417a. Upon the "H" level supplied to the AND gate 417a, the switch circuit 413c is switched to connect the constant current source 414 to the B point. As a result, it is possible to supply the current IOL from the constant current source 414 to the DUT 5 through an input/output terminal 4b of the dynamic load current output circuit 43, the B point and the transmission line 1. In this case, since a "L" level signal is applied to the AND gate 417b through the inverter 418c, the output of the AND gate 417b becomes "L", so that the switch circuit 413d connects the constant current source 415 to the ground terminal (GND).

On the other hand, when the driver 2 outputs a predetermined waveform signal to the input/output terminal 5a of the DUT 5, the bit signal I/O becomes "H". Therefore, a "L" level signal is supplied to the AND gates 417a and 417b, so that the AND gates are closed to connect the constant current sources 414 and 415 to the ground terminals GND through the switch circuits 413c and 413d, respectively, making the B point high impedance (Hi-Z).

The operation of the dynamic load current output circuit 43 in the IC tester is the same as that of the dynamic current load circuit 41 shown in FIG. 1.

Figure 4:
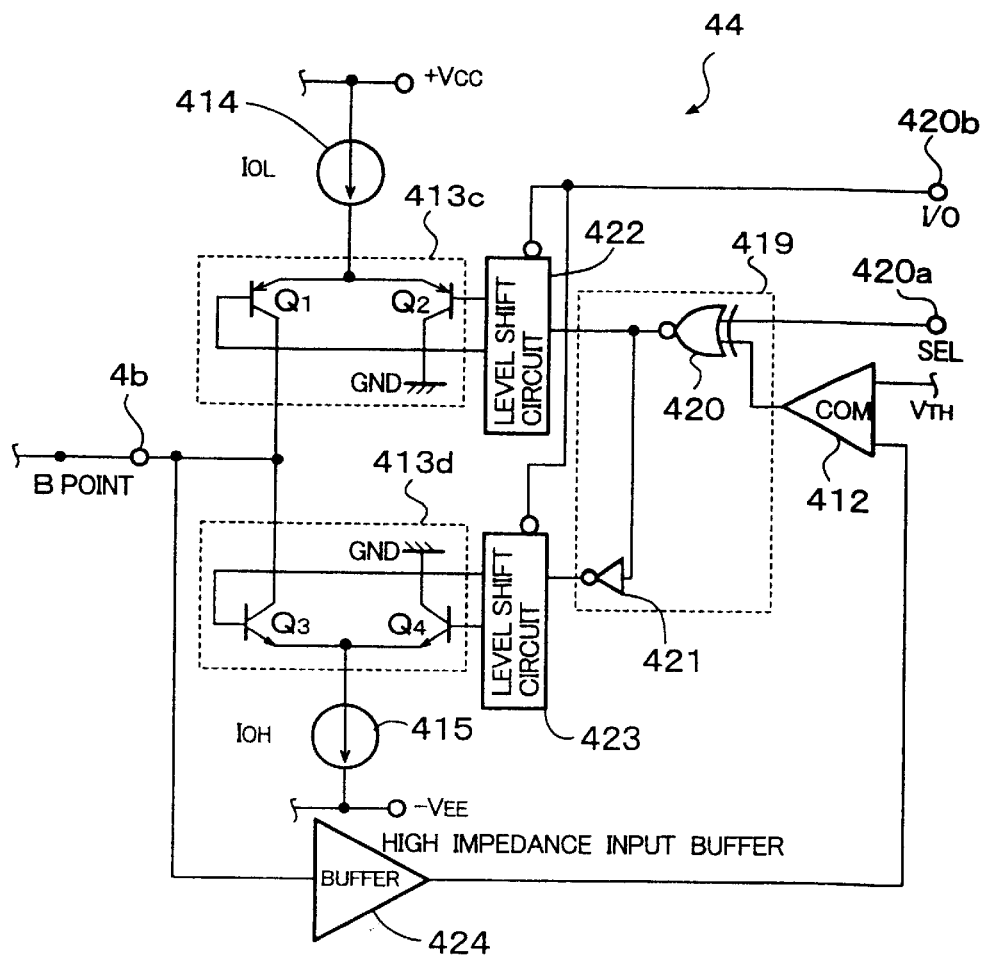
FIG. 4 shows a modification of the dynamic load current output circuit shown in FIG. 3, which can select a similar operation to that of a conventional dynamic load current output circuit when a delay time of a transmission line is out of problem.
Figure 5:
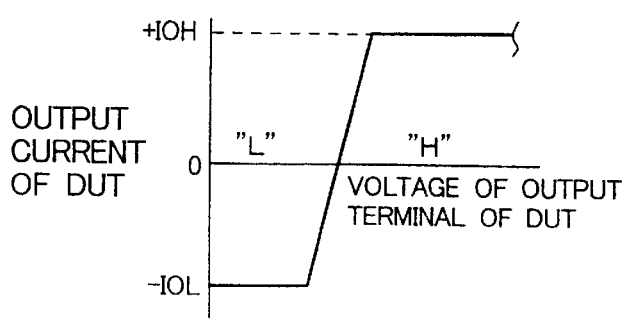
FIG. 5 is an output voltage vs. current characteristics of a DUT.

FIG. 4 shows a circuit diagram of a modification of the dynamic current load circuit 43 shown in FIG. 3. With this modification, an operation similar to that of the dynamic load current output circuit 40 shown in FIG. 6 can be selectively utilized in a case where the delay time of the transmission line 1 does not provide any problem.

In the dynamic load current output circuit 44 shown in FIG. 4, which is the modification of the dynamic load current output circuit 43 shown in FIG. 3, the switch circuit 413c comprises a current switch circuit constructed with PNP bipolar transistors Q1 and Q2, which receive the current IOL from the constant current source 414 and the switch circuit 413d comprises a current switch circuit composed of NPN bipolar transistors Q3 and Q4, which receive the current IOH from the constant current source 415.

A control circuit 419 corresponding to the control circuit 417 shown in FIG. 3 is constructed with a coincidence detection circuit (NOT-EXOR gate) 420 and an inverter 421. Further, level shift circuits 422 and 423 are provided between the control circuit 420 and the switch circuits 413c and 413d, respectively.

Further, a high input impedance buffer amplifier (or a voltage follower) 424 is provided between the comparator 412 and the B point.

The level shift circuits 422 and 423 function to convert "H" and "L" levels of the bit signal I/O received at input terminals thereof through a terminal 420b connected to the waveform formatter 6 into drive signals of the PNP and NPN bipolar transistors, respectively. That is, the level shift circuits 422 and 423 are enabled when the bit signal I/O is in "L" level. Further, the level shift circuit 422 receives an output of the coincidence detection circuit 420 and the level shift circuit 423 receives the output of the coincidence detection circuit 420 through the inverter 421. Therefore, the level shift circuits 422 and 423 perform reverse operations in response to mutually inverted "H" and "L" signals.

When the level shift circuit 422 receives a "H" level input from the coincidence detection circuit 420, the PNP bipolar transistor Q1 is turned ON and the PNP bipolar transistor Q2 is turned OFF, so that the current IOL is supplied from the constant current source 414 to the B point through the PNP bipolar transistor Q1. When the level shift circuit 422 receives a "L" level input from the coincidence detection circuit 420, the PNP bipolar transistor Q1 is turned OFF and the PNP bipolar transistor Q2 is turned ON, so that the current IOL flows to the ground terminal through the PNP bipolar transistor Q2. When the level shift circuit 423 receives a "H" level input from the coincidence detection circuit 420 through the inverter 421, the NPN bipolar transistor Q3 is turned ON and the NPN bipolar transistor Q4 is turned OFF, so that a current corresponding to the current IOH is sunk from the B point to the negative power source −VEE through the NPN bipolar transistor Q3 and the constant current source 415. When the level shift circuit 423 receives a "L" level input from the coincidence detection circuit 420 through the inverter 421, the NPN bipolar transistor Q3 is turned OFF and the NPN bipolar transistor Q4 is turned ON, so that the current IOL is sunk from the ground terminal to the negative power source −VEE through the NPN bipolar transistor Q4.

When the bit signal I/O is "H" level, the level shift circuits 422 and 423 are fixed to state in which the circuits receive "L" input signal even if the input signal is "H". Therefore, the PNP bipolar transistor Q1 and the NPN bipolar transistor Q3 are turned OFF, so that the B point is set to high impedance state (Hi-Z).

One input 420a of the coincidence detector circuit 420 is supplied with a selection signal SEL from a CPU 7 and the other input thereof is supplied with an output of the comparator (COM) 412.

An operation of the circuit shown in FIG. 4 will be described under an assumption that the dynamic load current output circuit is in a state where the output of the DUT 5 is received, that is, the bit signal I/O is in "L" level.

First, an operation of the dynamic load current output circuit shown in FIG. 4 in a case where, when the output of the DUT 5 is received, the selection signal SEL is set to "H" will be described.

When the output of the comparator 412 is "H", that is, the B point is in "H" state, the coincidence detection circuit 420 outputs "H" level, so that "H" level signal is inputted to the level shift circuit 422 and "L" level signal is inputted to the level shift circuit 423. As a result, the PNP bipolar transistor Q1 is turned ON and the NPN bipolar transistor Q3 is turned OFF, so that the current IOL is supplied to the B point from the constant current source 414. In this case, the PNP bipolar transistor Q2 and the NPN bipolar transistor Q4 are turned OFF and ON, respectively.

On the other hand, when the output of the comparator 412 is "L", that is, the B point is in "L" state, the coincidence detection circuit 420 outputs "L" level, so that "L" level signal is inputted to the level shift circuit 422 and "H" level signal is inputted to the level shift circuit 423. As a result, the PNP bipolar transistor Q1 is turned OFF and the NPN bipolar transistor Q3 is turned ON, so that the current IOH is sunk from the B point to the constant current source 415. In this case, the PNP bipolar transistor Q2 and the NPN bipolar transistor Q4 are turned ON and OFF, respectively.

Therefore, this circuit operates similarly to the embodiment shown in FIG. 3.

The operation of the dynamic load current output circuit 44, in a case where the selection signal SEL is set to "L" when the output of the DUT 5 is received, becomes opposite to that mentioned above. This operation is the same as that of the conventional circuit shown in FIG. 6.

That is, when the B point level is "H", the comparator 412 outputs a "H" level and the coincidence detection circuit 420 outputs "L". Therefore, the level shift circuits 422 and 423 are inputted with "L" and "H", respectively. As a result, the NPN bipolar transistor Q3 and the PNP bipolar transistor Q1 are turned ON and OFF, respectively, and the current IOH is sunk from the B point to the constant current source 415.

On the other hand, when the B point level is "L", the comparator 412 outputs a "L" level and the coincidence detection circuit 420 outputs "H". Therefore, the level shift circuits 422 and 423 are inputted with "H" and "L", respectively. As a result, the NPN bipolar transistor Q3 and the PNP bipolar transistor Q1 are turned OFF and ON, respectively, and the current IOL is supplied from the constant current source 414 to the B point.

In the latter case, the dynamic current load circuit 44 discharges the current IOL when the B point is "L" and sinks the current IOH when the B point is "H". Therefore, the operation is the same as that of the dynamic load current output circuit 40 shown in FIG. 6.

Since the level of the selection signal SEL supplied to the input terminal 420a of the coincidence detection circuit 420 can be freely set by an output of the CPU 7, it is possible by this modification to select one of the operation of the conventional dynamic current load circuit shown in FIG. 6 and the operation of any of the present dynamic load current output circuits 41, 42 and 43.

Thus, it is possible to control the direction of the current from the dynamic load current output circuit 44 regardless of the voltage at the B point (connecting point 4a) and, in the case where the rising time and the falling time of the output signal from the DUT 5 does not cause any problem with respect to the delay time of the transmission line 1 when the B point is connected to the DUT 5 through the transmission line 1, to select the operation similar to that of the conventional dynamic load current output circuit to thereby supply a load current flowing in an appropriate direction corresponding to the rising and falling times of the output signal of the DUT 5 to the latter.

Although, in the described embodiments, the dynamic load current output circuit switches the impedance of the input/output terminal thereof according to the bit signal I/O for ON/OFF controlling the I/O switch such that the impedance of the input/output terminal becomes high. However, it is possible to switch the impedance of the input/output terminal of the dynamic load current output circuit according to not the bit signal but other control signal. Further, in the described embodiments, the output signal of the DUT is obtained from the input/output terminal thereof. However, when the input/output terminal of the dynamic load current output circuit is connected to an output terminal of the DUT through another transmission line, the impedance switching by the bit signal for ON/OFF controlling the I/O switch becomes unnecessary since only the output signal of the DUT is received.

What is claimed is:

1. A load current output circuit for supplying a load current to an electronic device to be tested by an IC tester, which tests a state of a waveform of an output signal of said electronic device by supplying a predetermined waveform signal from a driver to said electronic device through a transmission line and receiving the output signal of said electronic device, which is changed from a high level to a low level or from a low level to a high level, through said transmission line or other transmission line, said load current output circuit comprising a detection circuit for detecting a voltage level on a portion of said transmission line on a side thereof, which receives said output signal from said electronic device under test through said transmission line or said other transmission line, wherein a predetermined current is pulled in from said transmission line or said other transmission line when the voltage level detected by said detection circuit is in low level and a predetermined current equal to or different from said predetermined current to be pulled in is supplied to said transmission line or said other transmission line when the detected voltage level detected by said detection circuit is in high level.

2. The load current output circuit as claimed in claim 1, further comprising a current supply circuit, said current supply circuit being adapted to pull in from said transmission line or said other transmission line a current corresponding to a predetermined current portion of a current discharged from said electronic device when the output signal thereof is in high level in a case where the voltage level on said portion of said transmission line on said side thereof, which receives said output signal from said electronic device under test through said transmission line or said other transmission line, is low level and to supply to said transmission line or said other transmission line a current corresponding to a predetermined current portion of a current sunk when the output signal thereof is in low level in a case where the voltage level on said portion of said transmission line on said side thereof, which receives said output signal from said electronic device under test through said transmission line or said other transmission line, is high level.

3. The load current output circuit as claimed in claim 2, wherein said detection circuit comprises a comparator circuit responsive to a predetermined reference voltage to determine whether said voltage level is low level or high level and said current supply circuit comprises a first constant current source for pulling the current and a second constant current source for discharging the current.

4. The load current output circuit as claimed in claim 3, further comprising a switch circuit responsive to a control signal for switching between a state in which said driver outputs the predetermined waveform and a state in which the output signal of said electronic device is received and the result of comparison of said comparator circuit to select and connect either one of said first and second constant current sources according to the result of comparison of said comparator circuit when said control signal indicates the state in which the output signal is received.

5. The load current output circuit as claimed in claim 4, wherein said switch circuit switches to a high impedance when the control signal indicates the state in which the predetermined waveform is outputted.

6. The load current output circuit as claimed in claim 5, further comprising a register and a digital/analog converter circuit, wherein the predetermined reference voltage is generated by digital/analog conversion of a data set in said register externally of said load current output circuit and said comparator circuit generates a low level or a high level as a result of comparison thereof.

7. The load current output circuit as claimed in claim 6, further comprising a control circuit for generating a signal for reversing the result of comparison of said comparator circuit.

8. The load current output circuit as claimed in claim 7, wherein said control circuit comprises a coincidence detection circuit supplied with a control signal of low or high level inputted externally of said load current output circuit and the output of said comparator circuit.

9. An IC tester for testing a state of a waveform of an output signal of an electronic device by supplying a predetermined waveform signal from a driver to said electronic device through a transmission line and receiving the output signal of said electronic device, which is changed from a high level to a low level or from a low level to a high level, through said transmission line or other transmission line, comprising:

a comparator for determining whether a voltage level of said output signal is high level or low level with respect to a reference voltage; and a load current output circuit including a detection circuit for detecting a voltage level of the output signal of said electronic device supplied from said electronic device to a point of said load current output circuit through said transmission line or said other transmission line, wherein said load current output circuit pulls in a first predetermined current from said transmission line or said other transmission line when the voltage level detected by said detection circuit is in low level and supplies a second predetermined current equal to or different from the first predetermined current to said transmission line or said other transmission line when the voltage level detected by said detection circuit is in high level.

10. The IC tester as claimed in claim 9, further comprising a current supply circuit, said current supply circuit being adapted to pull in from said transmission line or said other transmission line a current corresponding to a predetermined current portion of a current discharged from said electronic device when the output signal thereof is in high level in a case where the voltage level on said portion of said transmission line on said side thereof, which receives said output signal from said electronic device under test through said transmission line or said other transmission line, is low level and to supply to said transmission line or said other transmission line a current corresponding to a predetermined current portion of a current sunk when the output signal thereof is in low level in a case where the voltage level on said portion of said transmission line on said side thereof, which receives said output signal from said electronic device under test through said transmission line or said other transmission line, is in high level.

11. The IC tester as claimed in claim 10, wherein said detection circuit comprises a comparator circuit responsive to a predetermined reference voltage to determine whether said voltage level is low level or high level and said current supply circuit comprises a first constant current source for pulling the current and a second constant current source for discharging the current.

12. The tester as claimed in claim 11, further comprising a switch circuit responsive to a control signal for switching between a state in which said driver outputs the predetermined waveform and a state in which the output signal of said electronic device is received and the result of comparison of said comparator circuit to select and connect either one of said first and second constant current sources according to the result of comparison of said comparator circuit when said control signal indicates the state in which the output signal is received.

13. The IC tester as claimed in claim 12, wherein said switch circuit switches to a high impedance when the control signal indicates the state in which the predetermined waveform is outputted.

* * * * *